United States Patent [19]

Bonneau et al.

[11] Patent Number: 5,038,192
[45] Date of Patent: Aug. 6, 1991

[54] GATE ARRAY CELL HAVING FETS OF DIFFERENT AND OPTIMIZED SIZES

[75] Inventors: Martine Bonneau, Itteville; Eric Gouze, Grenoble; Robert Hornung, Mennecy; Ieng Ong, Antony; Jean-Marc Piccino, Evry, all of France

[73] Assignee: International Business Machines Corporation, Armonk, N.Y.

[21] Appl. No.: 504,153

[22] Filed: Apr. 3, 1990

[30] Foreign Application Priority Data

Apr. 28, 1989 [EP] European Pat. Off. ........ 89480071.3

[51] Int. Cl.5 ..................... H01L 27/02; H01L 29/78
[52] U.S. Cl. ......................................... 357/45; 357/42
[58] Field of Search .................................. 357/42, 45

[56] References Cited

U.S. PATENT DOCUMENTS

4,692,783  9/1987  Monma et al. .................... 357/45

FOREIGN PATENT DOCUMENTS

0131463  1/1985  European Pat. Off. ........... 357/45
6065546  4/1985  Japan ................................. 357/45

OTHER PUBLICATIONS

Article entitled "A 240k Transistor CMOS Array With Flexible Allocation of Memory and Channels," by H. Takahashi et al., in *IEEE Journal of Solid-State Circuits*, vol. SC-20, No. 5, pp. 1012–1017; dated Oct. 1985.
Article entitled "A Triple-level Wired 24k-gate CMOS Gate Array," by T. Saigo et al., in IEEE Journal of Solid-State Circuits; vol. SC-20, No. 5, pp. 1005–1011, dated Oct. 1985.
Article entitled "Fujitsu Ups and Gate-array Ante: 90,000 Usable Gates," by B. C. Cole, in Electronics; vol. 61, No. 7; pp. 77–78, date Mar. 31, 1988.
Article entitled "A 6K-gate CMOS Gate Array," by H. Tago et al., in IEEE Journal of Solid-Sate Circuits; vol. SC-17, No. 5, pp. 907–912, dated Oct. 1982.

*Primary Examiner*—Jerome Jackson, Jr.
*Attorney, Agent, or Firm*—Otho B. Ross; Richard A. Romanchik

[57] ABSTRACT

A CMOS FET master slice integrated circuit (20) of the gate-array type implemented in a semiconductor logic chip, comprises a plurality of core cells (CELL1, CELL2, ...) arranged adjacent one another on a repetitive basis in a row direction to form horizontal stripe shaped functional gate region (21) of a determined height (H). Each core cell (e.g., CELL1) is comprised of four different sized devices: one small and one large NFET (N1.1, N2.1), thus one small and one larger PFET (P1.1, P2.1), that are disposed in a column direction. The NFETs have separate gate electrodes (GN1.1, GN2.1) to define individual devices, while the PFETs have preferably a common gate electrode (GP1) to define a single device. The relative size of NFETs and PFETs have been optimized to provide the required functionality to the latches and to ensure the balanced rise and fall delays in a maximum of basic logic circuits of the chip. As a result, the use of such core cells, allows that complex logic functions, such as latches, can be implemented in gate arrays that have a density and performance comparable with standard cell circuits. In addition, the use of these core cells also permits optimization of other basic logic circuits (INV, NOR, ...) that are used in critical logic paths and clock distribution trees, where balanced delays are highly desirable.

3 Claims, 4 Drawing Sheets

PRIOR ART

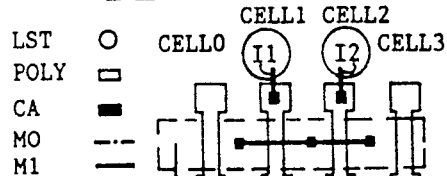
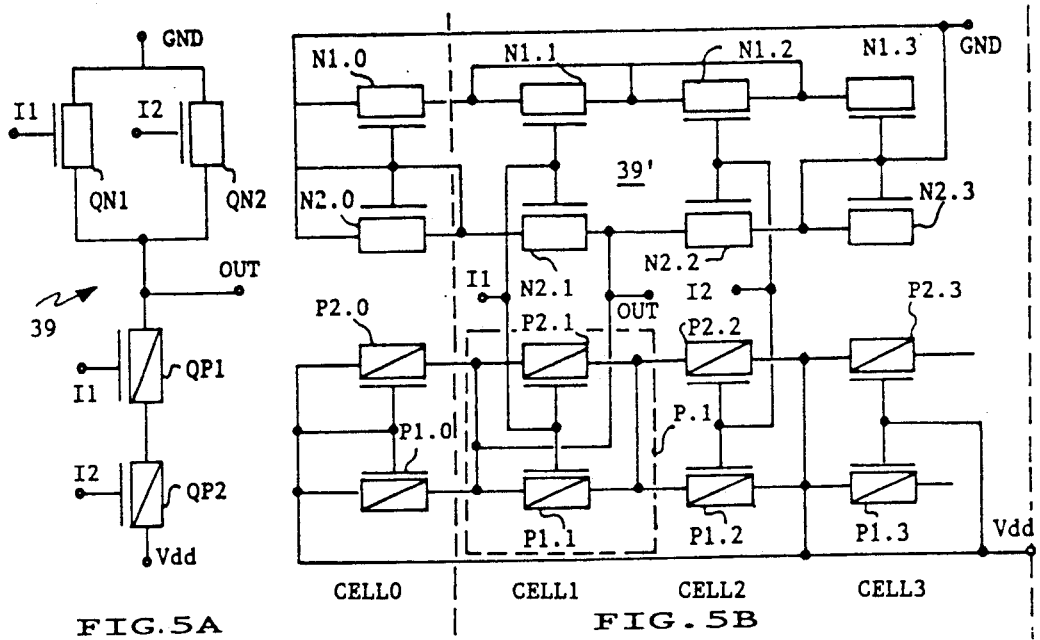
FIG.5A  FIG.5B
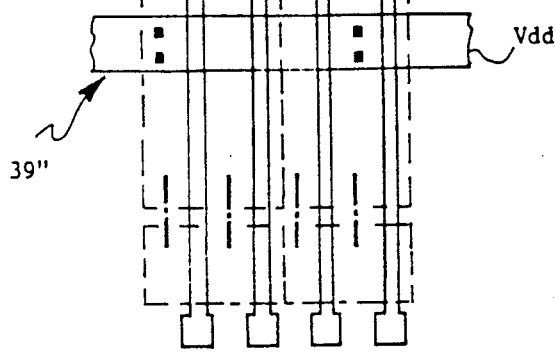
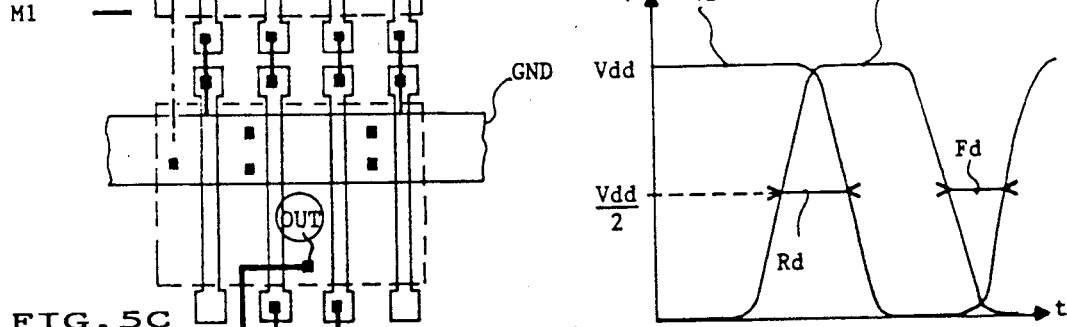
FIG.5C  FIG.5D

GATE ARRAY CELL HAVING FETS OF DIFFERENT AND OPTIMIZED SIZES

This invention relates to the design of Very Large Scale Integrated Circuits (VLSIC) of the master slice type in Complementary Metal Oxide Field Effect Transistor (CMOS FET) technology, and more particularly, to an improved cell containing four CMOS FET devices of different and optimized sizes that can be used in gate arrays. Because of its optimized configuration, the improved cell allows the implementation of all simple or complex logic functions in gate arrays with the best density/performance compromise.

A key factor contributing to the rapid advance of data processing systems is the physical design of integrated circuits determining such characteristics as device density, speed, circuit complexity, dissipated power, and so forth.

As it is known, various basic options are open to the circuit designer in arranging elementary components such as transistors, on the surface of an integrated circuit chip to form circuits capable of performing desired logic functions.

For years, circuits have been designed and manufactured in accordance with the customer's specifications to meet the requirements of a specific application. This conventional approach is often referred to as the "full custom" concept. This is time-consuming and costly, because the topology of the chip must be adapted to the needs of a single user, and all associated masks must be manufactured especially for this purpose. Also, many different masks must be designed and any modification thereof requires a complete redesign of the whole set of masks.

The so-called "semi custom" concept appears to be much more promising. Two different approaches have been considered for far. In the "standard cell" or "master image" approach, pre-characterized circuits are used, that are designed to perform elementary logic functions described in a library. This library, which may comprise a large number of "books" (NAND gates, latches, ... ) and macros (RAMs, ROS, ALU, ... ), makes it possible to obtain high-performance devices and high chip density.

In the "master slice" approach, originally developed in relation to bipolar devices, pre-diffused circuits are used. Here, all wafers are processed identically as far as the semiconductor substrate is concerned, and only the final metallization steps that constitute the "personalization" or "customization" differ, depending on the application involved. This approach is especially advantageous in CMOS FET technology, when the configuration of the circuits can be arranged in the form of arrays, usually referred to as "gate arrays." Gate arrays are becoming increasingly popular with the development of circuits so called "application specific integrated circuits" or ASICs. A gate array is comprised of stripes of NFETs and PFETs delimited in identical elementary cells arranged to form rows and columns. Each cell consists of a fixed number of complementary transistor pairs, whose size and characteristic, have been tailored to optimize certain parameters to meet users'needs. By interconnecting devices cells, a logic circuit or "book" can be formed which will perform the desired logic function. Knowing the arrangement of background cells on the surface of the chips, one can use automatic device placement and wiring tools to establish the desired interconnections. Data concerning the masks for the various customization levels are supplied by automatic mask-generating tools from automatic wiring programs. Therefore, the gate array approach is a valuable compromise between, (1) an increased density and speed of circuits integrated in the silicon substrate, and (2) a reduction of costs and delays in the manufacturing of semiconductor logic chips.

However, the gate array approach could have a significant edge over the standard cell, should the two following problems be solved:

1) implementing latches in gate arrays requires many more devices than in the standard cell approach. As a result, integration density of the chip is significantly lowered. Latches represent a large portion of the silicon area in semiconductor logic chips. Statistics indicate that 20 to 50 percent of the silicon area in CMOS gate arrays is used by latches, the average being around 40 percent.

2) in addition to latches, many other basic logic functions such as INV, NAND, NOR gates, etc., are integrated in the semiconductor logic chip. It is often desirable to have all these functions optimized to have balanced (symmetrical) rise and fall delays in signal transitions. This ensures smooth data processing in critical logic paths. Because standard gate arrays, have a fixed background (one fixed size for NFETs and one fixed size for PFETs), only one logic function can be optimized in that respect.

These problems are detrimental to a more generalized use of gate arrays, and will now be discussed in more detail.

To illustrate the first problem, the Polarity Hold Shift Register Latch (PHSRL), one of the most frequently used latch circuits, has been chosen.

The schematic of a conventional master/slave CMOS high density LSSD PHSRL latch circuit IO is shown in FIG. 1. LSSD means Level Sensitive Scan Design, a testing method of combinatorial logic circuits pioneered by B. Eichelberger in the 1970s. Circuit 10 of the single ended data input type, is composed of two parts. Each part provides an output signal, referred to as L1 and L2, at terminals 11 and 12 respectively. The storage cell SC of each part is made with two cross-coupled inverters: SC1 in the upper part comprised of FETs P11, N11, P12, N12 and SC2 in the lower part comprised of FETs P13, N13, P14, N14. SC1 is conventionally driven by a standard inverter I1 for the data input DO, applied at terminal 13, and by a pass transistor (transfer gate) N15 for the clock CO. The scan in signal I0 is applied to SC1 via terminal 14, inverter I2, and pass transistor N16, controlled by clock A0. The upper part further comprises an output buffer B1, consisting of a CMOS FET inverter to supply output signal L1 at terminal 11. Similar construction applies to the lower part. SC2 is driven by the potential that exists at the common node 15 of SC1 through pass transistor N17. Storage cells, buffers and inverters are biased between the first and second supply voltages (Vdd and Gnd). The 'WRITE' operation of the upper part is enabled when clock C0 is at high level ('1'). In this case, pass transistor N15 is turned 'on,' and the voltage at node 16 will be forced to '1' or '0' with respect to the data . The 'WRITE' operation is complete when clock C0 is at low level, the data is then latched.

To switch the circuit of FIG. 1 when the clocks are activated, a dissymetry between the cross-coupled inverters is necessary, otherwise the storage cell will never switch when such a single ended data input circuit is used. The above operation can be properly achieved only if FETs P11, N11, P12, and N12 have an adequate transconductance (W/L ratio). Generally, the W/L ratio of FETs P12 and N12 is much smaller than the W/L ratio of FETs P11 and N11. Similar requirements apply for the lower part. The latch circuit of FIG. 1 can be easily implemented in a standard cell, because the size of FETs can be tailored at will, while in CMOS gate arrays, the problem is different because only two fixed FET widths are available. As a result, the latch circuit of FIG. 1, although it uses the minimum number of FETs, cannot be used with a traditional gate-array cell, since it would not be functional. The necessary dissymetry of the latch is generally achieved by introducing clock controlled pass transistors in the feedback loops of the storage cells, as it will be explained later in conjunction with FIG. 2. A similar problem exists when analog circuits have to be implemented in gate arrays. In analog circuits, it is often desirable to have variously-sized FETs. To implement this, in conventional gate arrays, it may be possible to connect identical FETs in series or in parallel. In the latter case, however, the area required to implement the circuit may become too large.

FIG. 2 shows the single ended output latch of FIG. 1 adapted to operate in a gate array environment. Corresponding elements bear the same references. The LSSD PHSRL circuit 17 of FIG. 2 requires true and inverting clocks (e.g. A0 and AN) to control the pass transistors introduced in the feedback loops of the storage cells. Consequently, three supplementary inverters I3, I4 and I5 are required. In addition, the three pass transistors N15, N16, N17 have been doubled by connecting a complementary device in parallel, to ensure a full voltage swing. Finally, complementary pass transistor pairs N18/P18, N19/P19, and N20/P20 are now necessary in the clocked feedback loops. As a result, the number of FETs totals 30 in circuit 17 (FIG. 2) compared to 15 in circuit 10 (FIG. 1).

Other solutions to ensure the desired dissymetry include:

1) using a double-ended data input structure, that allows the latch to be switched by simultaneously applying symmetrical commands D0 and DN on the two sides of the storage cell. This is described in the article: "Fast shift register latch in CMOS technology" by R. Hornung et al. published in the IBM TDB, Vol. 27, N°. 7A, December 1984, pp 3894–3896.

2) adding devices in series in the cross-coupled inverters to lower the impedance of one leg, as described in EP patent application Publication Number 273082 assigned to the same assignee as of the present invention.

All these circuits have similar performances, allowing valid comparisons therebetween. Wherever it is desirable to have FETs of different sizes, the individual FETs must be connected either in series or in parallel to form the desired devices. In all cases, density of integration is then decreased. Excluding the FETs in buffers in the count, the number of FETs is 30 in the circuit of FIG. 2, 26 in the circuit described in the article and 30 in the circuit subject of the above mentioned patent application. Those figures have to be compared to 15 in the circuit of FIG. 1 of the present application.

Let us discuss now the problem of balanced delays. Circuits with balanced delays are not extensively used on a chip because the minimum average delay is reached with unbalanced circuits, and, in some cases a compensation may occur randomly at path level. However, balanced delays are the key to optimize those logic paths such as critical logic paths and clock distribution trees, which require equal rise and fall delays for the clock generation. In critical logic paths, the faster transition has no effect on the chip cycle time, but generates an higher than necessary noise on the power busses. In clock distribution trees, circuits have balanced delays guarantee a proper propagation of the signal, i.e. no pulse shrink and a constant non-overlap time between the clocks. The ratio WP/WN of the respective widths of the PFET and the NFET forming a basic pair determines whether the delays are balanced or not. Because of the fixed background, the WP/WN ratio is constant for standard gate arrays, thus delays cannot be balanced for all the logic circuits embedded in the chip. However, three possible combinations are offered on two columns: WP/WN, 2WP/WN, and WP/2WN by connecting FETs in parallel. For example, 2WN is the width that corresponds to a FET device formed by paralleling two NFETs. However, paralleling FETs must be used cautiously in order to save silicon area. As a consequence, in conventional gate arrays, only one logic book, e.g., NOR circuit or function is optimized in terms of balanced delays.

In summary, in a standard cell environment, the desired dissymetry and balanced delays may be obtained using FETs of different sizes in the silicon substrate whose sizes are adjusted for each circuit, to provide devices having the desired electrical characteristics. For a determined logic circuit the width (W) and the channel length (L) of the FETs determine the main electrical characteristics: (1) the W/L ratio for an individual FET device, and (2) the sum WP+WN and the ratio WP/WN, in a pair of CMOS FETs, where WP and WN are widths of the PFET and N FET. In such an environment, these ratios values can be tailored at will, but, at the expense of a longer processing time for engineering changes (ECs). This is not possible in conventional gate arrays because of the fixed background. Lastly, it should be recognized that the channel length (L) should be selected to be the smallest that is offered by the available technology.

Accordingly, there is a real need for an improved gate array having FETs of different and optimized sizes to accommodate the implementation of logic circuits with the same efficiency (performance and density) as the standard cell approach, while, still keeping the specific advantages of the gate array approach in terms of short processing time in case of engineering changes.

It is therefore, a primary object of the present invention to provide an improved core cell which includes four FETs of different and optimized sizes for easy and efficient implementation of the whole library of logic circuits in master-slice type chips and more particularly in gate arrays.

It is another object of the present invention to provide an improved core cell having four FETs of different and optimized sizes, to allow the implementation of complex logic circuits, such as latches, in gate arrays that can compete with the standard cell approach in terms of density and performance.

It is still another object of the present invention, to provide an improved core cell having four FETs of different and optimized sizes to allow implementation of circuits with balanced rise and fall delays, for smooth data processing in the critical paths of gate arrays.

It is yet further object of the present invention to provide an improved core cell having four FETs of different and optimized sizes to allow the implementation of analog circuits in gate arrays, as well as logic circuits.

These objects and others are achieved according to the present invention by a master slice integrated circuit chip of the gate array type, comprising at least one stripe shaped functional gate region of a determined height including a plurality of core cells arranged adjacent one another on a repetitive basis along a row direction; said circuit being characterized in that each core cell includes four different sized FETs in a column direction: a first small NFET of a first width WN1; a second large NFET of a second width WN2; a first small PFET of a first width WP1; a second large PFET of a second width WP2. In addition, the relative widths relation between said FETs, is so optimized to ensure both latch functionality and balanced delays for the maximum number of logic circuits implemented in the chip. The width relation depends on the technology in some respect. In a standard CMOS FET technology, experiments have shown that the optimized width relation between the four FETs, say WP2/WN2/WP1/WN1 is approximately 7/3.5/1.5/1.

Figures 3A, 3B:
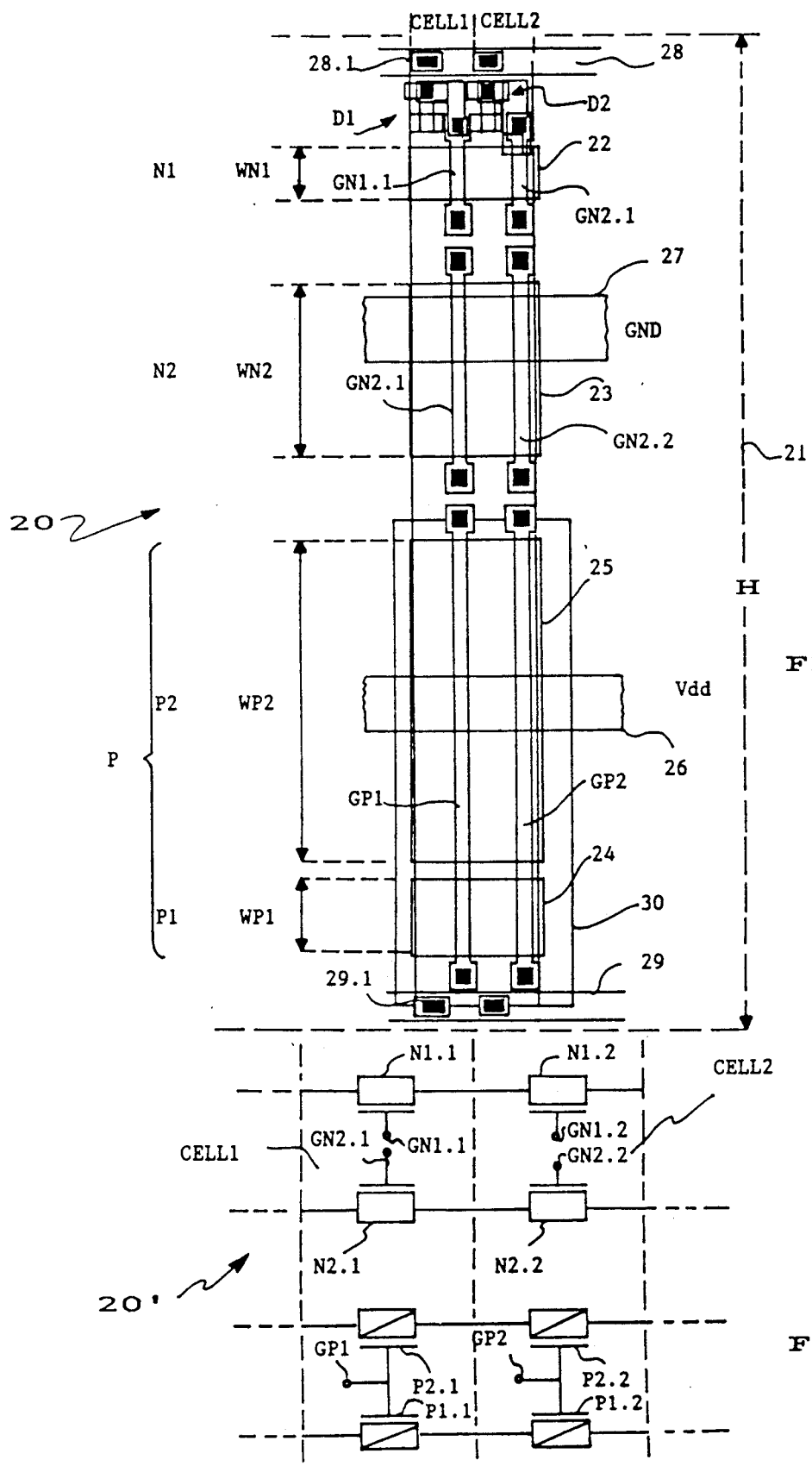

FIGS. 3A and 3B respectively show the topography of two adjacent gate array core cells of the present invention, which include FET devices of different and optimized widths and the diagram of the equivalent electrical circuit.

Figure 4:
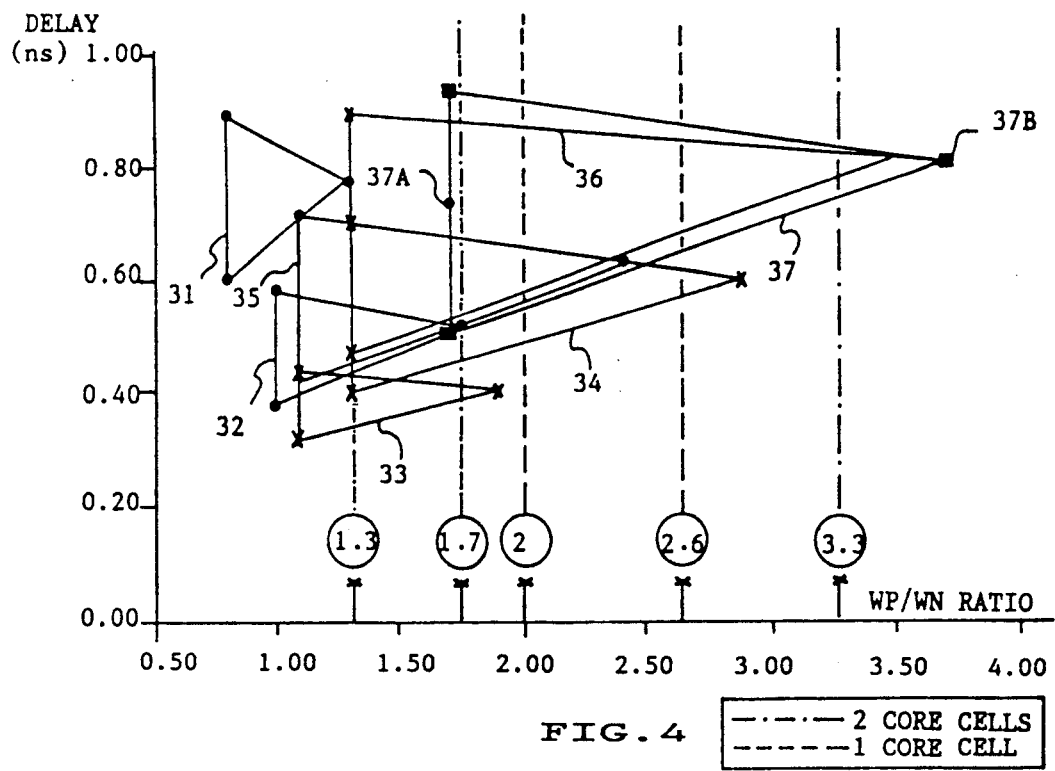

FIG. 4 shows the rise and fall delays versus WP/WN ratios for different basic logic functions/circuits.

FIGS. 5A, 5B, 5C and 5D respectively illustrate the schematic of a 2-Way NOR logic circuit, its equivalent electrical circuit, its topography when implemented in a gate-array chip with the gate array core cell of the present invention and the waveforms of the input/output signals with balanced rise/fall delays that are obtained.

Figure 1:
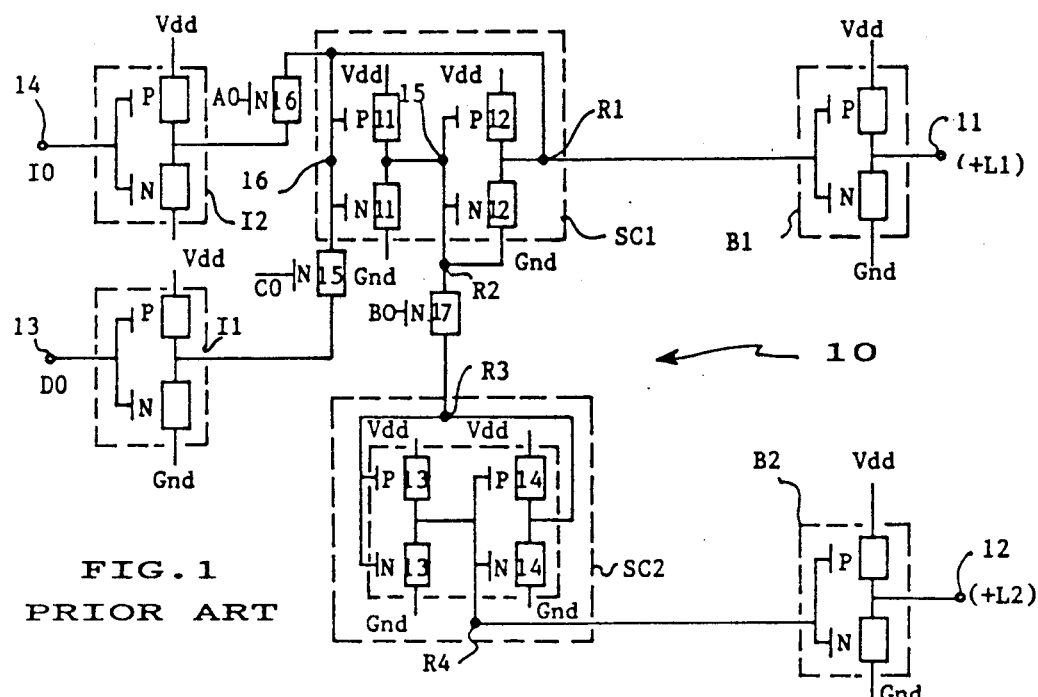
FIG. 1 shows a conventional PHSRL circuit of LSSD type suitable for implementation in a chip of the pre=characterized or standard cell type.
Figure 2:
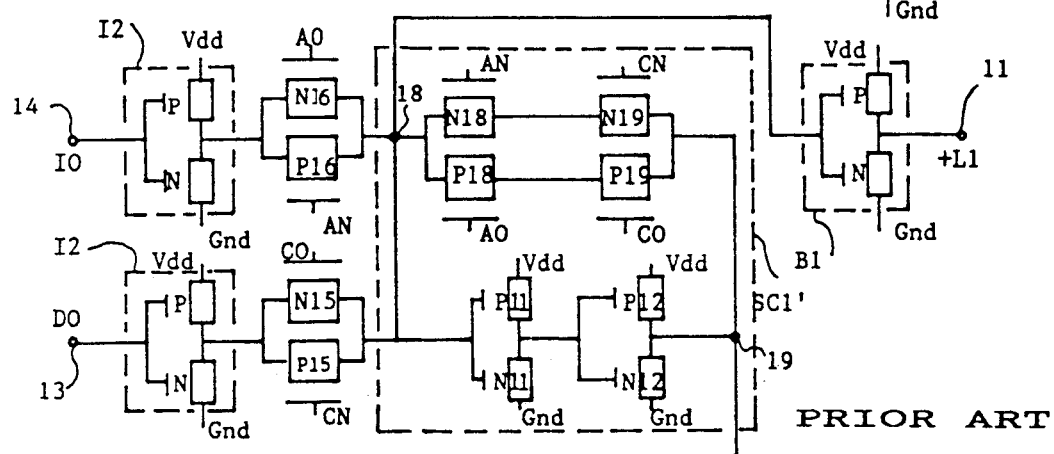
FIG. 2 shows a conventional PHSRL circuit of the LSSD type suitable for implementation in a chip of the prediffused or gate array type.
Figure 2:
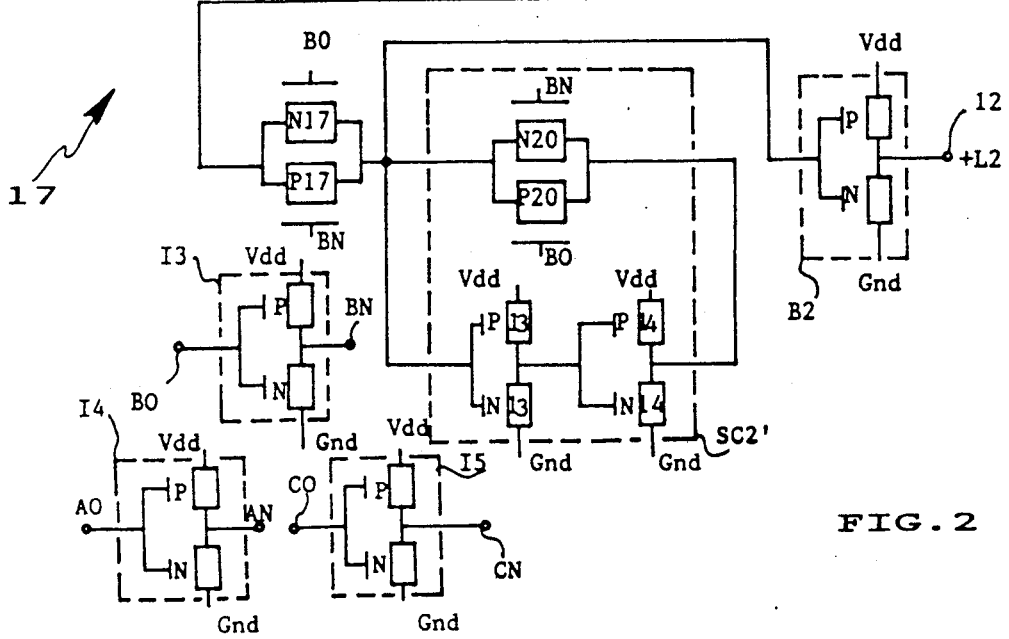
Figure 6:
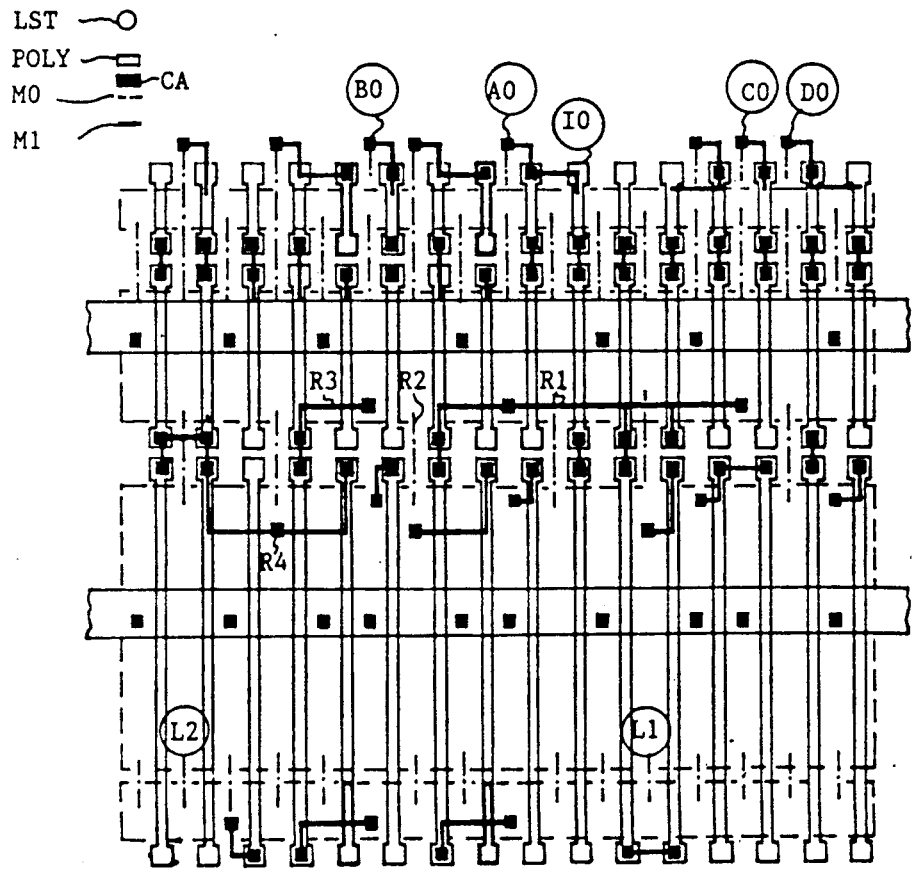

FIG. 6 shows the topography of the PHSRL circuit of FIG. 1 when implemented in a gate-array chip with the gate-array core cell of the present invention.

The manufacturing fundamentals of a gate array chip are described in EP-A-186720 assigned to the same assignee as of the present invention which is incorporated herein by reference. Briefly stated, two levels of hierarchy are defined to implement a complex function on such a chip made of a regular array of CMOS FETs (in the gate array approach) or of cells (in the standard cell approach):

interconnections of FETs to realize basic combinatorial or sequential functions. These interconnections are called "internal wiring."

interconnections of these basic functions. The are called "global wiring."

The global wiring runs on a virtual grid whose pitch is constant throughout the whole chip. This grid is made of vertical or horizontal tracks only on which wires can run. The technology provides the designers with several wiring planes. Generally, to minimize coupling capacitances, the wires run orthogonally to those of the upper and lower planes. (referred to as M1, M2, M3) and the most advanced ones feature a lower metal level (M0) used only for short connections.

These metal levels are used in the present description in the following way:

(1) M0 is used only for vertical diffusion to diffusion or diffusion to upper metallization (M1 through CA) including protective diodes.

(2) M1 and CA (via hole mask) are used for vertical or horizontal gate-to-gate, diffusion-to-diffusion or diffusion to gate connections.

These levels make the internal wiring of a basic function, to achieve the personalization of books.

(3) M1, M2, M3 are used to interconnect basic logic functions or books.

These levels make the global wiring of a chip.

The topography of the improved gate array core cell of the present invention is shown in FIG. 3A.

FIG. 3A shows a portion 20 of a continuous stripe of core cells arranged adjacent one another on a repetitive basis, in a row direction. For sake of simplicity, only two core cells, CELL1 and CELL2 are shown. The core cells are formed in a functional gate region 21 of a determined height H along the column direction. According to the invention, a core cell, e.g., CELL1, contains a total of 4 FETs or devices: one small NFET n1.1, one large NFET N2.1, one small PFET P1.1 and one large PFET P2.1, that are formed from continuous stripe shaped source/drain diffusion regions, respectively referenced 22, 23, 24 and 25 of respective widths WN1, WN2, WP1 and WP2. Therefore, in a core cell, e.g. CELL1, the P to N device count is 2 to 2. The generic names of these FETs, irrespective of the cell number, are: N1, N2, P1, and P2 respectively. The NFETs and PFETs are respectively located in the upper and lower parts of said functional gate region. The small devices are located close to the boundaries of said region, while the large devices are located in the central part of it.

In a preferred embodiment, NFETs N1.1 and N2.1 are individual devices because they have independent gate electrodes, unlike PFETs P1.1 and P2.1 that share PFET referenced P.1, if so desired. It is clear that an individual single PFET (e.g., P1.1) may be obtained by shorting drain-source regions of the other (e.g., P2.1). Paralleling devices is easy by using straps as mentioned above. The gate electrodes have a 'dog-bone' shape at their extremities, so that they can be accessed at both ends at M1 level. The advantages of this shape are twofold: (1) one track is available to connect two active gates at the top and bottom of the cell, (2) the input/output points or Logic Service Terminals (LSTs) of the circuits implemented with the improved cell of the present invention may be located either at the top, the middle or the bottom of the cell. So, some global wiring congestion can be avoided by statistically spreading LSTs across whole circuit area. LSTs are used to provide access for the input and output signals (e.g. I0, D0, ... and L1, ... in circuit 10 of FIG. 1). Two power busses 26 and 27 at M1 level are located over the P and N devices respectively to convey the positive supply voltage Vdd and the ground GND. Two power rails 28 and 29 at M1 level are located over the top and bottom of the cell to respectively bias the P substrate and the N well 30 respectively at contacts referenced 28.1, ... and 29.1, .... The biasing of the diffusion regions to the positive supply voltage Vdd and to the ground GND requires only contacts, and is thus transparent to the circuit internal wiring. Protective diodes D1 and D2 are necessary to avoid the gate breakdown which can occur during wafer processing because of electrostatic discharges (will not be represented in the topographies shown in FIGS. 5C and 6 for sake of simplicity).

FIG. 3B illustrates the diagram of the equivalent electrical circuit referenced 20' of portion 20 that is comprised of the two core cells CELL1 and CELL2 shown in FIG. 3A.

The determination of the respective widths of the four FETs is based on different requirements. The functionality of the latch requires a pair of small complementary FETs (e.g. P12, N12) and a pair of large FETs (e.g. P11, N11) in each storage cell (e.g., SC1). Another general requirement is to have the widths of PFETs larger than the widths of NFETs to compensate for the inferior carrier mobility of said PFETs. These requirements may be summarized by the following set of relations between FET widths:

WP2>>WP1, WN2>>WN1, WP1>WN1, and WP2>WN2.

Finally, the definite optimization is given by the balanced delay requirements, while still taking into account the ground rules of the technology.

Balance delay requirements will be better understood in conjunction with FIG. 4. FIG. 4 charts delay results for some basic logic circuits: e.g., INV, NAND, NOR, AOI ... versus WP/WN ratios for a standard technology. Each circuit is represented by a triangle. The vertex on the right side of each triangle represents the average ratio where the rise delay Rd equals the fall delay Fd. The upper point of the base delay (or fall) and the lower point the fall delay (or rise). The middle of this segment is the minimum average delay. Triangles referenced 31, 32, 33, 34, 35, 36 and 37 respectively represent 4 Way NAND, 2 Way NAND, INV 2 Way NOR, AOI 22, OAI 22, and 3 Way NOR circuits. The plot of FIG. 4 also shows that balanced delays are not always desirable minimum average delay because the average delay can be up to 10% higher in some cases. This is apparent from curve 37 in FIG. 4. It is clear that point 37B (balanced delay) is slightly above point 37A (minimum average delay). When balanced delays are not required, a WP/WN ratio of 2 is selected. This solution provides the best compromise between density (only one column of FETs is used) and performance (sum of widths on one column is maximized). FIG. 4 is therefore very helpful to determine the optimum device width that is required to obtain the balanced delays for a maximum of logic circuits.

Because the proposed core cell of the present invention offers 4 FETs of different sizes in one column, nine different ratios are theoretically allowed. But in reality, due to the relations discussed previously, only four of the possible ratios are really interesting for the circuit designer:

WP1+WP2/WN1+WN2, WP1+WP2/WN2,
WP2/WN1+WN2, WP2/WN2.

Other ratios are not significantly different.

As a result, the definite optimized values for WN1, WN2, WP1 and WP2 may be then deduced from the above and finalized. For example, in a standard CMOS FET technology, the following values have been determined: WN1=3μ, WN2=10 μm, WP1=4.4 μm, and WP2=21.6 μm. The size relation between widths: WP2/WN2/WP1/WN1 is then 7/3.5/1.5/1.

With these values, the following ratios are appropriate to compose some of the circuits below:

WP1+WP2/WN1+WN2=2 to be used for INV
WP1+WP2/WN2=2.6 to be used for AOI22,2 Way NOR
WP2/WN1+WN2=1.7 to be used for 2 Way NAND
WP1+WP2/WN1+WN2 (or WP.1/WN1+WN2) means for example, that an inverter circuit INV is implemented in one core cell with: (1) a PFET device that is formed by paralleling the P1 and P2 FETs (that is equivalent to say the P.1 device mentioned above) and (2) a NFET device that is formed by paralleling individual N1 and N2 FETs.

The approximation can even be improved when the P and N devices are created from P and N FETs of two core cells. The following interesting ratios can then be added to the previous ones e.g.,:

2WP2/WN1+WN2=3.3 to be used for 3 Way NOR, OAI22
WP1+WP2/2WN2=1.3 to be used for 4 Way NAND Although all these figures are technology-dependent, they do not change significantly.

In conclusion, FIG. 4 shows that, with the three different ratios that are offered by one core cell, it is possible to get reasonably well balanced delays (compared to ideal figures) for a set of simple books. This can be significantly improved when devices are created from FETs located in two core cells, say in two columns.

FIG. 5A shows the electrical schematic of a standard 2 Way NOR logic circuit 39 that uses two pairs of CMOS FETs Qn1, QN2 and QP1, QP2. Each pair, e.g., QP1, QN1 is formed from a core cell line column. To approach the ideal ratio of 2.8 (see curve 34 in FIG. 4), small and large PFETs of the core cell have been paralleled, while the small NFET is no longer used. In other words, the PFET device, e.g., QP1 is P.1 that is formed by paralleling FETs P1.1 and P2.1. The NFET device, e.g., QN1, is formed by FET N2.1. Similar construction applies to the other pair QP2, QN2. As a result, the WP/WN ratio of device pairs in circuit 39 is of the type given by WP1+WP2/WN2, say is about 2.6. FIG. 5B shows its equivalent electrical representation referenced 39' when implemented with core cells of the present invention. The real topography of the circuit of FIG. 5B when physically implemented in a gate array with the improved core cell of the present invention, is shown in FIG. 5C where it bears is reference 39''. Three cells are necessary to complete the 2 Way NOR book. Two core cells, e.g., CELL1 and CELL2, are used to implement the logic circuit. A third core cell, e.g., CELL3, is necessary for isolation purposes with the next book (not represented) on the right side. The fourth core cell, e.g., CELL0, is shown on the left side of the book, but belongs to the previous book. In CELL3, FETs are connected for isolation purposes. The circuit has been designed to have balanced rise and fall delay characteristics.

FIG. 5D shows the waveforms of the input and output signal, amplitude versus time. For a given full swing input signal referenced 40, there is shown the corresponding output signal referenced 41. It is clearly apparent from FIG. 5D that circuit 39 exhibits balanced delays (Rd=Fd).

FIG. 6 shows the physical implementation or layout of latch of FIG. 1 when implemented with the proposed core cell. Sixteen core cells, i.e., 16 pairs of N devices (N1 and N2 FETs) and P devices (P1 and P2 FETs) are used. Indeed, FETs N11 and P11 (see FIG. 1) which are used to carry out the first stage of the cross coupled inverters of storage cell SC1 in the upper part of circuit 10, are respectively implemented by large devices N2 and P2. On the contrary, in the second stage, FETs N12 and P12 are implemented by the small devices N1 and P1 that are located respectively at the top and bottom of the core cell. Internal nodes R1 (or 16), R2 (or 15), R3, and R4 are indicated in FIG. 6 to show how the cross-coupled inverters SC1 and SC2 have been wired. In addition, NFETs and PFETs forming the buffers, e.g., B1, have to be large. They are implemented at least twice in paralleling devices N1+N2 and P1+P2. The AO, BO, CO clocks referenced in the latch circuit of FIG. 6 may be distributed at M1 level, as the scan in signal I0 (see FIG. 1). This is an interesting feature to have the clocks wired within the cell height H, and not at the outside of the cell. As a result, a shift register comprised of a plurality of PHSRL circuits can be easily implemented.

Generally speaking, the proposed core cell offers the possibility to implement high density circuits and in particular latches in a master-slice environment. The proposed basic cell offers the possibility to use the same circuitry (thanks to the small N1 and P1 devices) as in a standard cell environment with the same density and performance. As a result, the two large devices N2 and P2 are quite systematically used in all logic books. Small devices are mainly used in latch circuits to ensure the desired dissymetry for the latch functionality.

Compared with the schematic and layout of the traditional PH SRL described in the EP patent application cited earlier, which needs 12 cells (24 device pairs), if the same granularity of two is kept, the proposed basic cell reduces the device count by 33%. Because, for a typical gate array logic chip, approximately 40% of the internal cell area is used for latches, the basic cell offers a significant gain (about 13%) in density at the chip level. With a standard technology, up to 800 000 background core cells may be placed on a reasonable chip size (14.7×14.7 mm). The 'sea of gates' architecture is used with three levels of metal interconnection (M1, M2, M3) to achieve a maximum number of wireable circuits. To speak about density with a such integration, it is necessary to consider two different aspects: 1) the density at circuit level, and 2) the density at chip level (the number of reached wireable circuits).

As to the first aspect, its is common to get an equal density between gate arrays and standard cells for all the basic circuits except latches, which generally contribute approximately 15% of the functions on a typical part. (In gate arrays this be up to 40% of the total cells). For the combinatory circuits, the equal density may be explained because the electrical schematics are identical in the two approaches. The differences come only from an identical pitch of transistors for gate arrays and isolation by transistor instead of ROX (Recess Oxide) rupture for standard cells. These differences are of no importance. For the latches, the proposed gate array cell solves the density problem. So, we may consider that, at circuit level, we get the same density for the whole library.

As to the second point, say at chip level, considering a sea of gate architecture and three metal levels (2 horizontal and 1 vertical) the differences mainly come from the porosity of the circuits at M1 level. Indeed, this wiring level is used for both book personalizations and global wiring. Because of the fixed background in gate arrays, the book personalizations are more constraining and yield less tracks for global wiring than in the standard cell circuits.

At last five M1 wiring tracks are available with the proposed gate array (due to the M0 level which allows more flexibility). Even if this is less than could be reached with the standard cell, it is enough because the number of horizontal wiring tracks becomes higher (for most of the chip sizes considered) than in the vertical direction. Broadly, the resulting density is approximately the same as the standard cell one.

In summary, the main improvements provided by this improved gate array cell are listed below:

1. In the design of the latches, the same density and performance have been reached as for the standard cell, without any impact for the rest of the logic. As a result, the proposed gate array core cell allows: (1) an easy implementation of shift registers without any constraint for the global wiring, and (2) an equivalent density for the whole set of logic books with the same number of wireable circuits per chip. The proposed core cell may thus compete with the standard cell in terms of density.

2. The ability to get balanced rise and fall delays in the design of basic logic books (as principally required for clock distribution trees and critical logic paths) is valuable for the logic designer.

Therefore, the invention significantly contributes to enlarge gate array capabilities to render them more competitive for the future ASICs.

We claim:

1. A master slice integrated circuit of the gate array type implemented in a logic semiconductor chip comprising:
    at least one stripe shaped functional gate region (21) of a determined height (H), said gate region having a top and a bottom, including a plurality of core cells (CELL1, CELL2, ...) arranged adjacent one another on a repetitive basis in a row direction, characterized in that, each core cell (e.g. CELL1) includes four devices of different size arranged in a column direction from said top to said bottom;
    a first small NFET (N1.1) having a continuous striped shaped source/drain diffusion region of a first width (WN1);
    a second large NFET (N2.1) having a continuous striped shaped source/drain diffusion region of a second width (WN2);
    a first large PFET (P2.1) having a continuous striped shaped source/drain diffusion region of a third width; and,
    a second small PFET (P1.1) having a continuous striped shaped source/drain diffusion region of a fourth width (WP1).

2. The circuit according to claim 1 wherein said first and second PFETs (P2.1, P1.1) have a common gate electrode to form a single device (P.1) and the said first and second NFETs (N1.1, N2.1), have separated gate electrodes to form individual devices.

3. A master slice integrated circuit of the gate array type implemented in a logic semiconductor chip comprising:
    at least one stripe shaped functional gate region (21) of a determined height (H), having a plurality of core cells (CELL1, CELL2, ...) arranged adjacent one another on a repetitive basis in a row direction, characterized in that, each core cell (e.g.

CELL1) comprises four devices of different size arranged in a column direction;

a first small NFET (N1.1) having a first width (WN1);

a second large NFET (N2.1) having a second width (WN2);

a first large PFET (P2.1) having a third width (WP2); and, a second small PFET (P1.1) having a fourth width (WP1), wherein the width relation WP2/WN2/WP1/WN1 of said devices in at least one core cell is on the order of 7/3.5/1.5/1.

* * * * *